United States Patent
Kwon et al.

(10) Patent No.: US 8,901,949 B2
(45) Date of Patent: Dec. 2, 2014

(54) PROBE CARD FOR TESTING A SEMICONDUCTOR CHIP

(75) Inventors: Duk Kyu Kwon, Gyeonggi-do (KR); Kyu Han Lee, Gyeonggi-do (KR); Yong Goo Lee, Seoul (KR)

(73) Assignee: Gigalane, Co., Ltd., Gyeonggi-Do (KR)

( * ) Notice: Subject to any disclaimer, the term of this patent is extended or adjusted under 35 U.S.C. 154(b) by 350 days.

(21) Appl. No.: 13/486,400

(22) Filed: Jun. 1, 2012

(65) Prior Publication Data

US 2012/0306523 A1 Dec. 6, 2012

(30) Foreign Application Priority Data

Jun. 2, 2011 (KR) ........................ 10-2011-0053118

(51) Int. Cl.
*H01L 29/24* (2006.01)
*G01R 31/28* (2006.01)
*G01R 1/073* (2006.01)

(52) U.S. Cl.
CPC ........ *G01R 31/2889* (2013.01); *G01R 1/07378* (2013.01)
USPC ............ 324/756.03; 324/755.05; 324/762.05; 257/E21.503; 257/E21.508; 257/E21.509

(58) Field of Classification Search
CPC ................. H01L 2924/00; H01L 2924/00014; H01L 2924/13099; H01L 2924/45144
USPC ............. 324/756.03, 754.07, 755.08, 755.01, 324/755.05, 762.05
See application file for complete search history.

(56) References Cited

U.S. PATENT DOCUMENTS

| | | | | |
|---|---|---|---|---|
| 5,974,662 | A * | 11/1999 | Eldridge et al. | 29/842 |
| 7,285,968 | B2 * | 10/2007 | Eldridge et al. | 324/750.03 |
| 2006/0279300 | A1 * | 12/2006 | Khandros et al. | 324/754 |
| 2010/0219852 | A1 * | 9/2010 | Yamada et al. | 324/754 |
| 2010/0253374 | A1 * | 10/2010 | Chen et al. | 324/754 |

* cited by examiner

*Primary Examiner* — Tung X Nguyen
*Assistant Examiner* — Alesa Allgood
(74) *Attorney, Agent, or Firm* — Harness, Dickey & Pierce, P.L.C.

(57) ABSTRACT

There is provided a probe card comprising a plurality of probe tips, each being ball-shaped or pillar-shaped and having a top end in contact with each of target chip pads to be tested; a first space converting unit; a second space converting unit; a frame configured to support the second space converting unit; an interposer unit; and a circuit board.

7 Claims, 12 Drawing Sheets

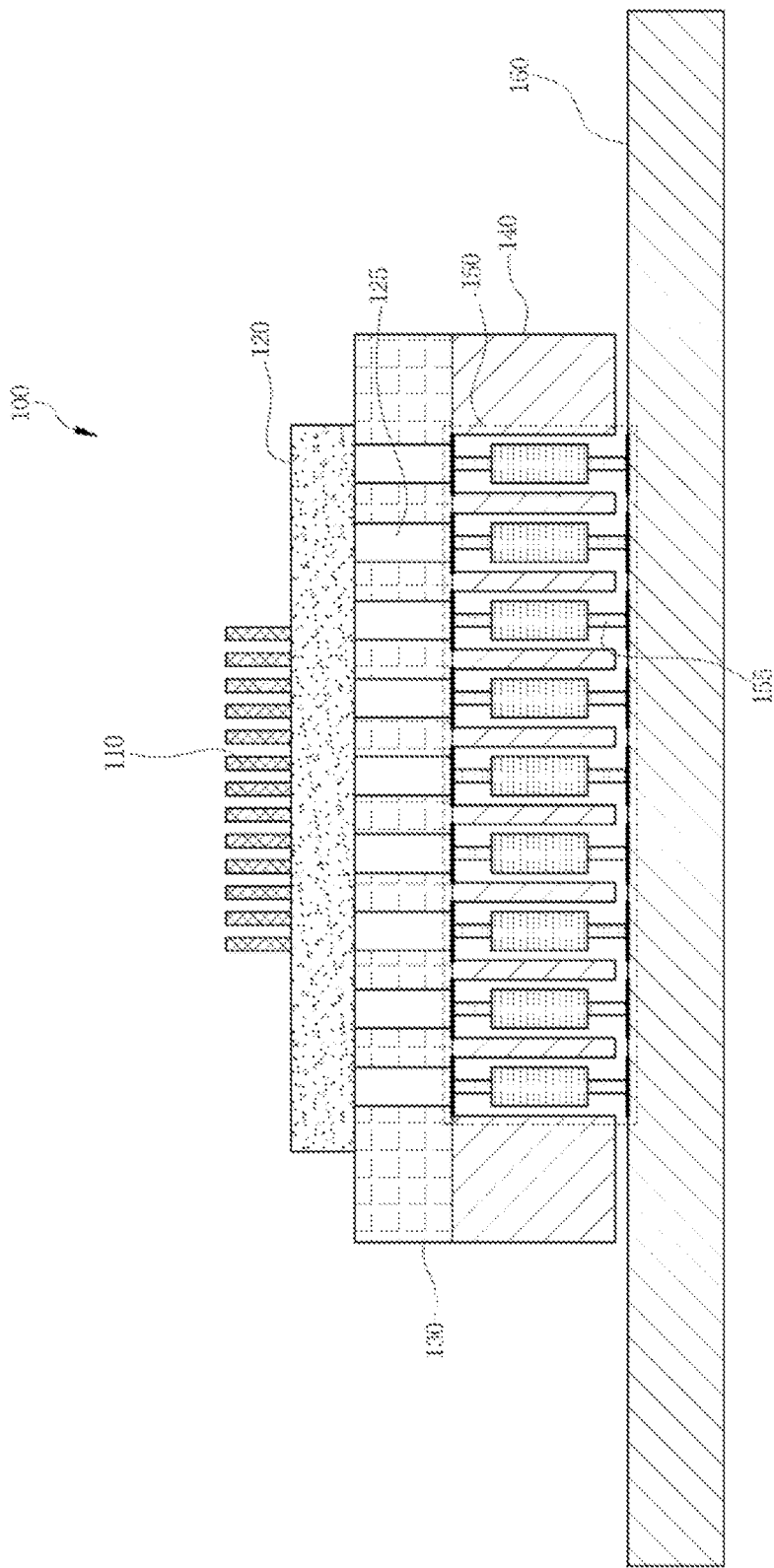

PROBE CARD FOR TESTING A SEMICONDUCTOR CHIP

CROSS-REFERENCE TO RELATED APPLICATION

This application claims the benefit under 35 U.S.C. §119 (a) of Korean Patent Application No. 10-2011-0053118, filed on Jun. 2, 2011, in the Korean Intellectual Property Office, the entire disclosure of which is incorporated herein by reference.

FIELD

The following description relates to a probe card, more particularly, to a probe card capable of performing a test on a chip pad of a narrow pitch by touching the chip pad to be tested.

BACKGROUND

This section provides background information related to the present disclosure which is not necessarily prior art.

In general, semiconductor devices may be manufactured by a fabrication process for forming on a wafer a circuit pattern and a contact pad for test and by an assembly process for assembling the wafer having the circuit pattern and the contact pad to a semiconductor chip.

Test process is performed between the fabrication process and the assembly process to test electrical characteristics of the wafer by applying an electrical signal to the contact pad formed on the wafer. This test process is performed to inspect for wafer defects and to remove a defective portion of the wafer during the assembly process.

Testing equipment, known as a tester, that applies an electrical signal to a wafer and another testing equipment, known as a probe card, that functions as an interface between the wafer and the tester are mainly used for the test process. The probe card may include a printed circuit board receiving an electrical signal applied from the tester and a plurality of probes contacting a contact pad formed on the wafer.

Recent high-density semiconductor chips lead to high-integration of a circuit pattern on a wafer through the fabrication process, and consequently, a gap between neighboring contact pads, that is, a pitch between the pads, becomes narrower. The conventional probe card performs a test using probe needles that protrude outwards with curved portions, and thus makes it difficult to test contact pads having a narrow pitch. In addition, it is difficult to test contact pads using the conventional probe card employing the probe needles when the contact pads are arranged in an area at a regular spacing.

SUMMARY

This section provides a general summary of the disclosure and is not a comprehensive disclosure of its full scope or all of its features.

The following description relates to a probe card capable of testing a semiconductor chip having contact pads arranged in an area with a narrow pitch by using straight-pillar-shaped or ball-shaped probe tips, instead of conventional curved probe needles.

In one general aspect, there is provided a probe card comprising: a plurality of probe tips, each being ball-shaped or pillar-shaped and having a top end in contact with each of target chip pads to be tested; a first space converting unit configured to have first wirings formed on a top surface thereof to be electrically connected to a bottom end of each of the probe tips and second wirings formed in multi-layers to be electrically connected to the wirings formed on the top surface; a second space converting unit configured to have third wirings formed on a top surface thereof to be electrically connected to the second wirings in multi-layers of the first space converting unit and pads disposed on a bottom surface that are electrically connected to the third wirings; a frame configured to support the second space converting unit; an interposer unit configured to comprise interposers being located in holes formed in the frame to support the second space converting unit, being electrically connected to the pads of the second space converting unit and providing elasticity; and a circuit board configured to support the interposer unit and transmit a test signal to the interposers that are electrically connected to the circuit board.

The frame may be coupled to at least one of the second space converting units and the circuit board at a predetermined spacing.

The plurality of probe tips may be coupled to a top surface of a silicon wafer and thus detachable from the first space converting unit and the silicon wafer may have a plurality of via-holes to electrically connect the probe tips and the pads on the bottom surface and enable the pads on the bottom surface to be electrically connected to the first wiring.

The first space converting unit may be configured to have a plurality of first via-holes to electrically connect the respective second wirings and the first wirings and a plurality of second via-holes to electrically connect the respective second wirings to pads disposed on a bottom surface of the first space converting unit, and the pads disposed on the first space converting unit may be electrically connected to the third wirings.

The first space converting unit may be configured to have multi-layers of polyimide and have at least one of the second wirings formed on an upper surface of each layer, and the second space converting unit may be configured to be formed of a silicon wafer and have a plurality of via-holes to electrically connect the third wirings and the pads disposed on the bottom surface of the second space converting unit.

The interposers may be pogo pins or curved pins that are interposed between the circuit board and the pads disposed on the bottom surface of the second space converting unit and provide elasticity, and each of the curved pins may be formed by integrating a first straight body to be electrically connected to the pad disposed on the bottom surface of the second space converting unit, a second straight body to be electrically connected to the circuit board, and a curved body electrically connected between the first and the second straight bodies to provide elasticity.

In another general aspect, there is provided a probe card comprising: a plurality of probe tips, each being ball-shaped or pillar-shaped and having a top end in contact with each of target chip pads to be tested; a first space converting unit configured to have first wirings formed on a top surface thereof to be electrically connected to a bottom end of each of the probe tips and second wirings formed in multi-layers to be electrically connected to the wirings formed on the top surface; a second space converting unit configured to have third wirings formed in multi-layers to be electrically connected to the respective second wirings at one end or the other end of the first space converting unit; a second space converting unit configured to have third wirings formed on a top surface thereof to be electrically connected to the second wirings in multi-layers of the first space converting unit and pads disposed on a bottom surface that are electrically connected to the third wirings; a frame configured to support the first space converting unit and the second space converting unit; an interposer unit configured to comprise interposers being located in a circumference of the frame to support the second space converting unit, being electrically connected to the third wirings formed in multi-layers of the second space converting unit and providing elasticity; and a circuit board configured to support the interposer unit and the frame and transmit a test signal to the interposers that are electrically connected to the circuit board.

The second wirings formed stepwise at one end or the other end of the first space converting unit may be compressively coupled to the third wirings formed stepwise at one end of the second space converting unit.

In another general aspect, there is provided a probe card comprising: a plurality of probe tips, each being ball-shaped or pillar-shaped and having a top end in contact with each of target chip pads to be tested; a first space converting unit configured to have first wirings formed on a top surface thereof to be electrically connected to a bottom end of each of the probe tips and second wirings formed in multi-layers to be electrically connected to the wirings formed on the top surface; a second space converting unit configured to have third wirings formed on a top surface thereof to be electrically connected to the second wirings in multi-layers of the first space converting unit and pads disposed on a bottom surface that are electrically connected to the third wirings; a first frame configured to support the second space converting unit; a first interposer unit configured to comprise first interposers being located in holes formed in the first frame to support the second space converting unit, being electrically connected to the pads of the second space converting unit and providing elasticity; a third space converting unit configured to have fourth wirings formed on a top surface thereof to be electrically connected to lower ends of the first interposers and fifth wirings in multi-layers to be electrically connected to the fourth wirings formed on the top surface; a second frame configured to support the third space converting unit; a second interposer unit configured to comprise second interposers being located in holes formed in the second frame to support the second space converting unit, being electrically connected to pads of the third space converting unit and providing elasticity; and a circuit board configured to support the second interposer unit and transmit a test signal to the second interposers that are electrically connected to the circuit board.

Other features and aspects may be apparent from the following detailed description, the drawings, and the claims.

BRIEF DESCRIPTION OF THE DRAWINGS

The drawings described herein are for illustrative purposes only of selected embodiments and not all possible implementations, and are not intended to limit the scope of the present disclosure.

FIG. 1 is a diagram illustrating an example of a probe card.

Figure 2A:
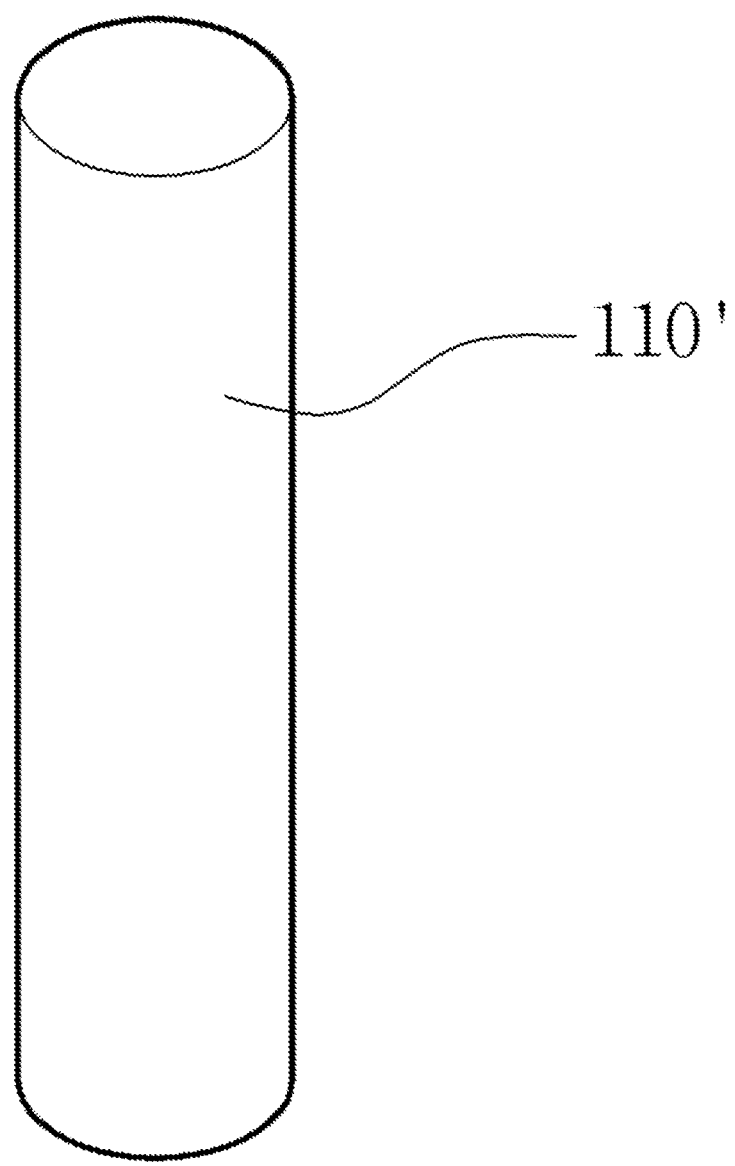
FIGS. 2(A) to 2(C) are diagrams illustrating examples of a probe tip shown in FIG. 1.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating an example of a probe card.

Referring to FIG. 1, the probe card 100 may include a plurality of probe tips 110, a first space converting unit 120, a second space converting unit 130, a frame 140, an interposer unit 150, and a circuit board 160.

The probe tips 110 may be in contact with corresponding target chip pads to be tested, and each probe tip 110 may be ball-shaped or pillar-shaped. For example, a top end of each of the probe tips 110 may be in contact with the corresponding target chip pad, and a lower end of each of the probe tips 110 may be connected to a top end of the first space converting unit 120. Although the probe tips 110 shown in FIG. 1 are pillar-shaped, this is only for purposes of example, and the shape of the probe tips 110 may vary, including ball-shaped and any other shaped. A pitch between every two of a plurality of probe tips 110 is the same as a pitch between the target chip pads. That is, according to the embodiment of the present invention, even when the target chip pads to be tested have a narrow pitch therebetween, the probe tips 110 are possible to be in contact with corresponding target chip pads by adjusting a pitch between the probe tips 110 to be the same as the pitch between the target chip pads.

The first space converting unit 120 may have first wiring formed on a top surface of the first space converting unit 120 to be electrically connected to the lower ends of the probe tips 110 and second wiring formed in multi-layers to be electrically connected to the first wiring formed on the top surface of the first space converting unit 120. For example, the first space converting unit 120 may have multi-layers of polyimide, and have one or more second wirings on an upper surface of each layer. Each second wiring may be electrically connected to at least one probe tip 110 through the wiring formed on the top surface of the first space converting unit 120. However, the configuration of the first space converting unit 120 is not limited to the above, and the first space converting unit 120 may be formed of a different material. The second wiring may be electrically connected to the first wiring through a first via-hole, and be electrically connected to pads formed on a bottom surface of the first space converting unit 120 through a second via-hole. However, the present invention is not limited to the above, and the electrical connection of the first space converting unit 120 may be implemented by a different means (for example, a bonding wire or an anisotropic conductive film, etc.) other than the via-hole. The first space converting unit 120 will be described in greater detail with reference to FIG. 3.

The second space converting unit 130 may include third wiring formed on a top surface that is electrically connected to the second wirings formed in multi-layers in the first space converting unit 120, and the third wiring may be electrically connected to pads disposed on a bottom surface of the second space converting unit 130. The second space converting unit 130 may include a silicon wafer and have a plurality of via-holes 135 to electrically connect the third wiring and the pads disposed on the bottom surface of the second space converting unit 130. However, the present invention is not limited to the above, and the second space converting unit 130 may be made of a different material, and the third wiring may be electrically connected to the pads through a different means (for example, a bonding wire, anisotropic conductive film, etc.) other than the via-holes. The second space converting unit 130 will be described in greater detail with reference to FIG. 3.

The frame 140 may be interposed between the second space converting unit 130 and the circuit board 160 to support the second space converting unit 130. In addition, the frame 140 may include a hole passing through the frame 140 from the top to the bottom end to have the interposer unit 150 being inserted thereinto. The frame 140 may be coupled to at least one of the second space converting unit 130 and the circuit board 160 at a predetermined spacing. In other words, the frame 140 may be coupled to at least one of the second space converting unit 130 and the circuit board 160 at a predetermined spacing so as to ensure a space in which an interposer 155 that will be described below can move freely enough to provide stable elasticity. In the example illustrated in FIG. 1, the frame 140 is coupled to the second space converting unit 130 without a gap therebetween, and is coupled to the circuit board 160 at a predetermined spacing, but the present invention is not limited thereto. The frame 140 may be coupled to the second space converting unit 130 at a predetermined spacing, and coupled to the circuit board 160 without spacing, or the frame 140 may be coupled to the circuit board 160 with a predetermined spacing, or coupled to the second space converting unit 130 at a predetermined spacing. Although not illustrated in FIG. 1, a predefined coupling member (for example, a guide pin) is used to couple the frame 140 with the second space converting unit 130 or the circuit board 160 at a predetermined spacing. For example, a hole is formed on the frame 140 and the circuit board 160, and the coupling member is coupled to the hole, thereby coupling the frame 140 and the circuit board 160 at a predetermined spacing. There may be used a variety of coupling methods, and thus the detailed descriptions of the methods will be omitted.

The interposer unit 150 located inside the hole formed on the frame 140 may support the second space converting unit 130. The interposer unit 150 may include a guide frame (for example, a silicon wafer, etc.) and a plurality of interposers 155. The guide frame has a plurality of holes passing through a top and bottom of the guide frame and each of the interposers 155 electrically connects the pads disposed on the bottom surface of the second space converting unit 130 to the circuit board 160, and provides elasticity, being inserted into the holes of the guide frame. The interposers 155 may be pogo-pins or curved pins. Each of the curved pins may include a first straight body being electrically connected to the pad disposed on the bottom surface of the second space converting unit 130, a second straight body being electrically connected to the circuit board 160, and a curved body being electrically connected to the first straight body and the second straight body to provide elasticity thereto. The curved pins will be described in greater detail with reference to FIG. 4. The above provided is the interposers 155 that are pogo-pins or curved-pins, but the shape of the interposers 155 is not limited thereto. Different elements may be used other than the interposers 155 as long as they can electrically connect corresponding pads disposed on the bottom surface of the second space converting unit 130 and the circuit board 160 or electrically connect them while providing elasticity.

The circuit board 160 may support the interposer unit 150 and the frame 140, and transmit a test signal to the interposers 155 that are electrically connected to the circuit board 160. In specific, the circuit board 160 may transmit the applied test signal to the interposers 155 and the interposers 155 may transmit the test signal to the second space converting unit 130. The second space converting unit 130 may receive the test signal from the pads disposed on the bottom surface of the second space converting unit 130, and transmit the test signal to the third wiring through the via-holes 135. In addition, the first space converting unit 120 may transmit the test signal from the third wiring to the first wiring through the second wiring, and thereby the probe tips 110 electrically connected to the first wiring can receive the test signal. The probe tips 110 enable to transmit the test signal to the contacting target chip pads to be tested.

Figure 2B:
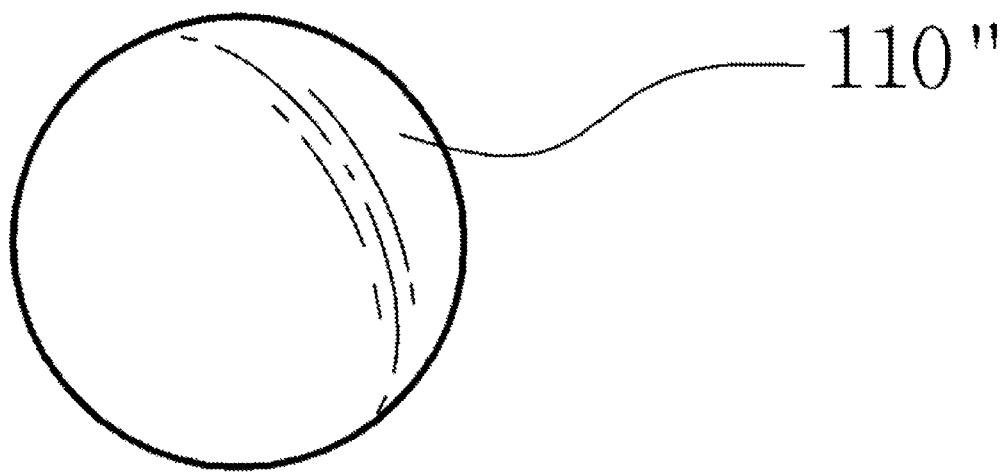
Figure 2C:
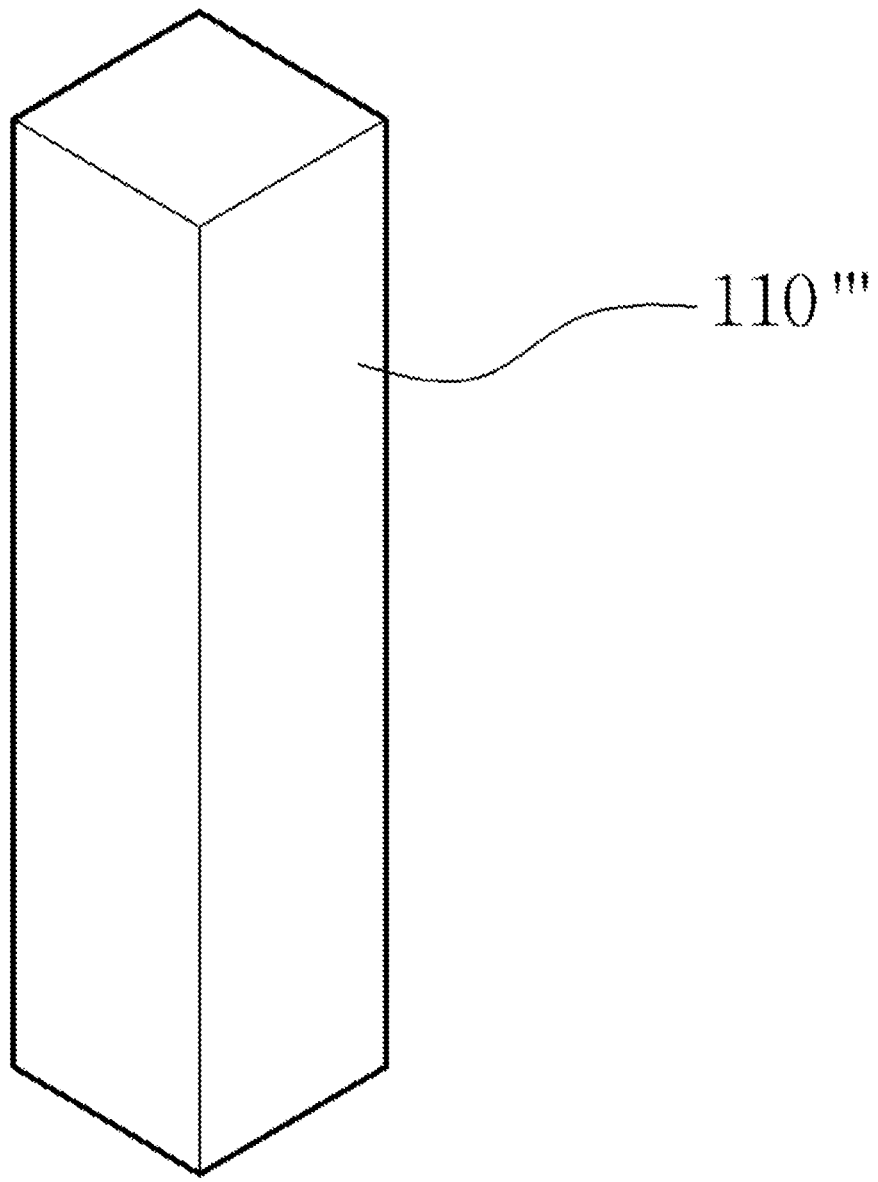

FIGS. 2(A) to 2(C) are diagrams illustrating examples of a probe tip of FIG. 1.

Referring to FIGS. 1 to 2(C), the probe tip 110 may be of a variety of shapes as described above. For example, the probe tip 110 may be a cylindrical-shaped probe tip 110' as shown in FIG. 2(A), a ball-shaped probe tip 110" as shown in FIG. 2(B), or a square-pillar shaped probe tip 110''' as shown in FIG. 2(C). The shapes shown in FIGS. 2(A) to 2(C) are only for purposes of examples, and the shape of the probe tip 110 may vary (for example, a polygonal pillar, a pillar having a groove, etc.).

Figure 3:
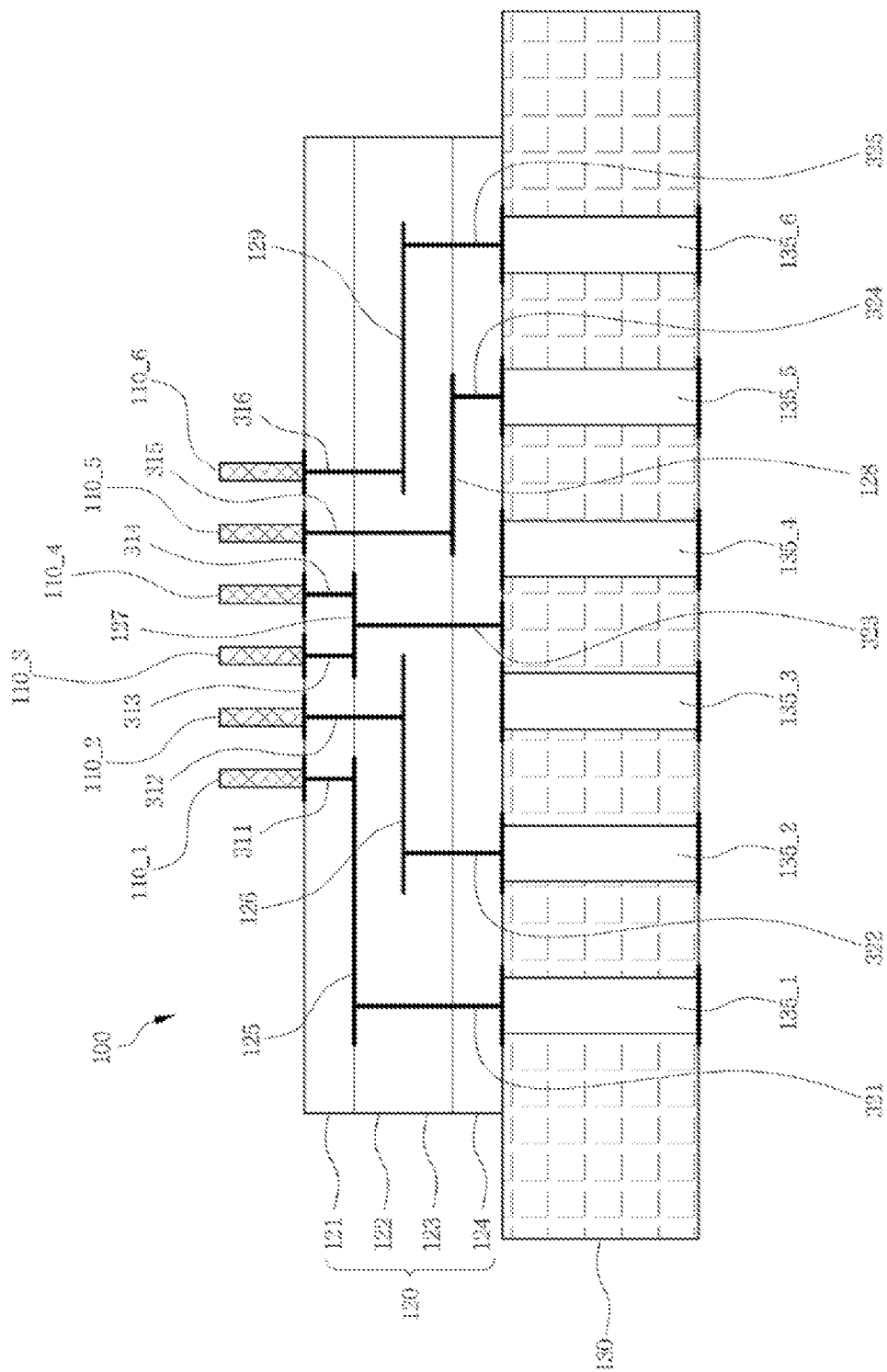
FIG. 3 is a diagram illustrating an enlarged view of a probe tip, a first space converting unit and a second space converting unit of a probe card shown in FIG. 1.

FIG. 3 is a diagram illustrating an enlarged view of the probe tip, the first space converting unit and the second space converting unit of the probe card shown in FIG. 1.

Referring to FIGS. 1 and 3, the first space converting unit 120 may include first wirings (not shown) and pads on a top surface to electrically connect the first wiring to a plurality of probe tips 110_1, 110_2, 110_3, 110_4, 110_5, and 110_6. The first space converting unit 120 may include multi-layers 121, 122, 123, and 124 of a predetermined insulation material, and include at least one or more second wirings 125, 126, 127, 128, and 129 on an upper surface of each layer. However, the disposition of the second wirings is not limited to the upper surface of each layer, and the second wirings may be disposed on a lower surface of each layer. For example, the insulation material may be polyimide.

The pads that are electrically connected to the first wiring may be electrically connected to the respective corresponding second wirings 125, 126, 127, 128, and 129 through corresponding first via-holes 311, 312, 313, 314, 315 and 316. The second wirings 125, 126, 127, 128, and 129 may be connected to the pad on the bottom surface of the first space converting unit 120 through corresponding second via-holes 321, 322, 323, 324, and 325. In addition, the pads formed on the first space converting unit 120 may be electrically connected to the third wiring, and the third wirings may be electrically connected to the pads disposed on a top surface of the second space converting unit 130. The second space converting unit 130 may include third via-holes 135_1, 135_2, 135_3, 135_4, and 135_5 to electrically connect the pads disposed on the top surface and the pads disposed on the bottom surface. The pads disposed on the second space converting unit 130 may be electrically connected to the corresponding interposers 155 as described above with reference to FIG. 1.

For example, under the assumption that the test signal is transmitted to the bottom surface of the second space converting unit 130 via the circuit board 160 and the interposers 155, the test signal transmitted through the third via-hole 135_1 may pass through the second via-hole 321, the second wiring 125, and the first via-hole 311 and reach the probe tip 110_1, and the test signal transmitted through the third via-hole 135_2 may pass through the second via-hole 322, the second wiring 126, and the first via-hole 312, and reach the probe tip 110_2. The test signal transmitted through the third via-hole 135_3 may pass through the second via-hole 323, the second wiring 127, and the first via-hole 313 and reach the probe tip 110_3, and the test signal transmitted through the third via-hole 135_4 may pass through the second via-hole 323, the second wiring 127, and the first via-hole 314 and reach the probe tip 110_4. That is, one second wiring may be electrically connected to a plurality of probe tips. In addition, the test signal transmitted through the third via-hole 135_5 may pass through the second via-hole 324, the second wiring 128, and the first via-hole 315 and reach the probe tip 110_5, and the test signal transmitted through the third via-hole 135_6 may pass through the second via-hole 325, the second wiring 129, and the first via-hole 316, and reach the probe tip 110_6.

FIG. 3 illustrates an example of the probe tip 110, the first space converting unit 120, and the second space converting unit 130, but the present invention is not limited thereto. There may be provided a different configuration as long as the probe tip 110, the first space converting unit 120, and the second space converting unit 130 can transmit a test terminal as described with reference to FIG. 1.

Figure 4:
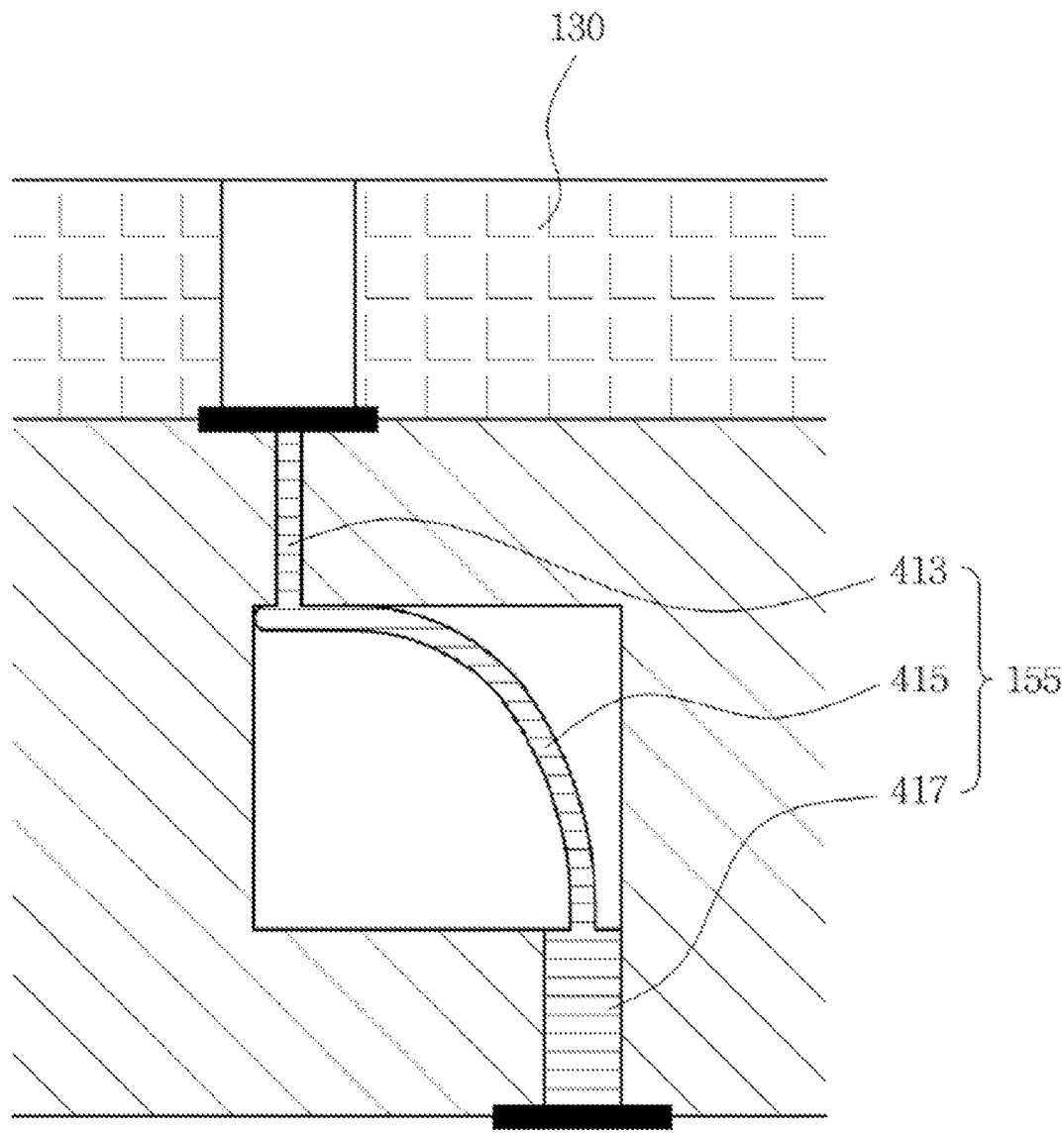
FIG. 4 is a diagram illustrating an example of an interposer of FIG. 1, which is a curved pin.

FIG. 4 is a diagram illustrating an example of an interposer of FIG. 1, which is a curved pin.

Referring to FIGS. 1 and 4, the interposer 155 may include a first straight body 413, a second straight body 417, and a curved body 415 which are integrated into one body. The first straight body 413 may be electrically connected to the pad disposed on the bottom surface of the second space converting unit 130, and the second straight body 417 may be electrically connected to the circuit board 160. The curved body 415 may be electrically connected between the first straight body 413 and the second straight body 417 and provide elasticity. In the case of the interposer 155 as a curved pin as shown in FIG. 4, a shape of the hole formed on the guide frame becomes significantly different from that of FIG. 1. In specific, the hole formed on the guide frame may include an upper hole into which the first straight body 413 is inserted, a lower hole into which the second straight body 417 is inserted, and a middle hole into which the curved body 415 is inserted. The middle hole may have a diameter which is wide enough for the curved body 415 to be inserted thereinto and prevented from being in contact with the middle hole even when the curved body 145 is elastic. However, the hole formed on the guide frame does not need to have the shape as shown in FIG. 4, and the hole may be varied in shape as long as the curved-pin interposer 155 can operate while being inserted into the hole.

Figure 5:
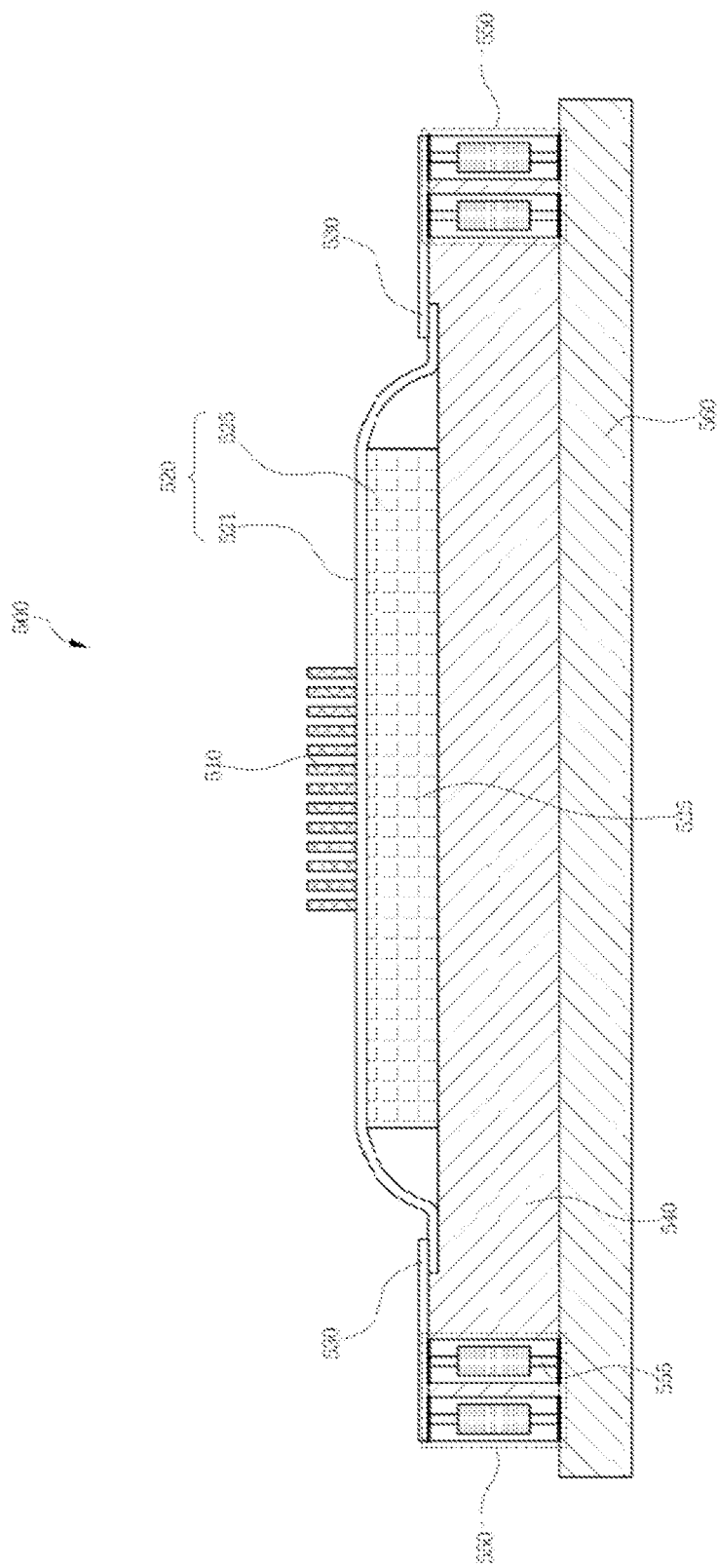
FIG. 5 is a diagram illustrating another example of a probe card.

FIG. 5 is a diagram illustrating another example of a probe card.

Referring to FIG. 5, the probe card 500 may include a plurality of probe tips 510, a first space converting unit 520, a second space converting unit 530, a frame 540, an interposer unit 550, and a circuit board 560.

The probe tips 510 may be ball-shaped or straight pillar-shaped and be in contact with the respective corresponding target chip pads to be tested. For example, a top end of the probe tip 510 may be in contact with the corresponding target chip pad and a lower end of the probe tip 510 may be connected to an upper portion of the first space converting unit 520. In FIG. 5, the probe tip 510 is pillar-shaped, but the shape of the probe tip 510 may be varied, as shown in FIGS. 2(A) to 2(C). A pitch between every two probe tips 510 may be the same as a pitch between the target chip pads.

The first space converting unit 520 may have first wiring formed on a top surface of the first space converting unit 520 to be electrically connected to the lower ends of the probe tips 510, and second wiring formed in multi-layers to be electrically connected to the first wiring formed on the top surface of the first space converting unit 520. For example, the first space converting unit 520 may have multi-layers of polyimide, and have one or more second wirings on an upper surface of each layer. Alternatively, the first space converting unit 520 may have multi-layers formed of polyimide on a flexible printed circuit board (FPCB), and have one or more second wirings on an upper surface of each layer. Accordingly, each of the second wirings may be electrically connected to at least one probe tip 510 via the wiring formed on the top surface of the first space converting unit 520. However, the first space converting unit 520 may be made of different materials and the type of material may vary. The second wiring may be electrically connected to the first wiring through a via-hole. The second wiring may be electrically connected to the first wiring through other elements (for example, a bonding wire, an anisotropic conductive film, etc.) The first space converting unit 120 may include a silicon wafer 525 that supports the second wiring formed in multi-layers. The first space converting unit 120 will be described in greater detail with reference to FIG. 6.

The second space converting unit 530 may include third wirings in multi-layers that are electrically connected to the second wirings at one end or the other end of the first space converting unit 520, the second wirings being formed in multi-layers of the first space converting unit 520. For example, the second space converting unit 530 may include multi-layers of polyimide, and include one or more third wirings on an upper surface of each layer. Alternatively, the second space converting unit 530 may include multi-layers formed of polyimide on a flexible printed circuit board (FPCB) and have the one or more third wirings formed on the upper surface of each layer, and the third-wiring-formed second space converting unit 530 may be upside down. In other words, one of the first space converting unit 520 and the second converting unit 530, each having the wirings formed in multi-layers, is upside down, and consequently, it can be obtained the same result as the wirings being formed on a lower surface of each layer. That is, the second wirings and the third wirings may be formed on surfaces in opposite directions. One end of the second space converting unit 530 and one end or the other end of the first space converting unit 520 may be formed to be stepwise and compressively coupled to each other. For example, the second space converting unit 530 and the first space converting unit 520 may be compressively coupled to each other on an outer side of the silicon wafer 525 or an upper surface of the frame 540. The way of coupling will be described in greater detail with reference to FIG. 6. However, the present invention is not limited thereto, and the second space converting unit 530 and the first space converting unit 520 may be coupled to each other in a different manner as long as the second wirings and the third wirings can be electrically connected with each other. The third wirings may be electrically connected to pads disposed on the bottom surface of the second space converting unit 530, but the present invention is not limited thereto. The second space converting unit 530 may be electrically connected to the third wirings by a different means (for example, a bonding wire, an anisotropic conductive film, or the like) not by the via-holes.

The frame 540 may be interposed between the first space converting unit 520 and the circuit board 560 and between the second space converting unit 530 and the circuit board 560, thereby supporting the first space converting unit 520 and the second space converting unit 530. In FIG. 5, the frame 540 is coupled to the first space converting unit 520, the second space converting unit 530, and the circuit board 560 without a gap. However, the present invention is not limited thereto, and the frame 540 may be coupled to at least one of the first space converting unit 520, the second space converting unit 530, and the circuit board 560 at a predetermined spacing, as described with reference to FIG. 1.

The interposer unit 550 may be disposed on a circumference of the frame 540 to support the second space converting unit 530. In addition, the interposer unit 550 may include a plurality of interposers 555 that are electrically connected to the third wirings formed in multi-layers in the second space converting unit 530 and provide elasticity. For example, the interposer unit 550 may include a guide frame (for example, a silicon wafer) having a plurality of holes, each passing through a top and bottom of the guide frame, and a plurality of first interposers 555 that are inserted into the holes of the guide frame. Each interposer 555 may be a pogo pin or a curved pin. The curved pin may include a first straight body to be electrically connected to a pad disposed on the bottom surface of the second space converting unit 530, a second straight body to be electrically connected to the circuit board 560, and a curved body to provide elasticity to the first straight body and the second straight body while being connected to the first and second straight bodies, which are integrated into one body. The curved pin is described in greater detail with reference to FIG. 4, and thus the detailed description thereof will not be reiterated. In the example of FIG. 5, the interposers 555 are pogo pins or curved pins, but the present invention is not limited thereto. Any other elements can be used as the interposers 555 as long as they can electrically connect corresponding pads disposed on the bottom surface of the second space converting unit 530 and the circuit board 560, or electrically connect them, providing elasticity.

The circuit board 560 may support the interposer unit 550 and the frame 540, and be capable of transmitting a test signal while being electrically connected to the interposers 555. That is, the circuit board 560 may transmit the applied test signal to the interposers 555 and the interposers 555 may transmit the test signal to the second space converting unit 530. The second space converting unit 530 may receive the test signal through the pads disposed on the bottom surface thereof, and transmit the received test signal to the third wiring. The first space converting unit 520 may transmit the test signal to the first wiring through the second wirings from the third wiring, and the probe tips 510 electrically connected to the first wiring may receive the test signal. The probe tips 510 may transmit the test signal to the contacting target chip pads.

Figure 6:
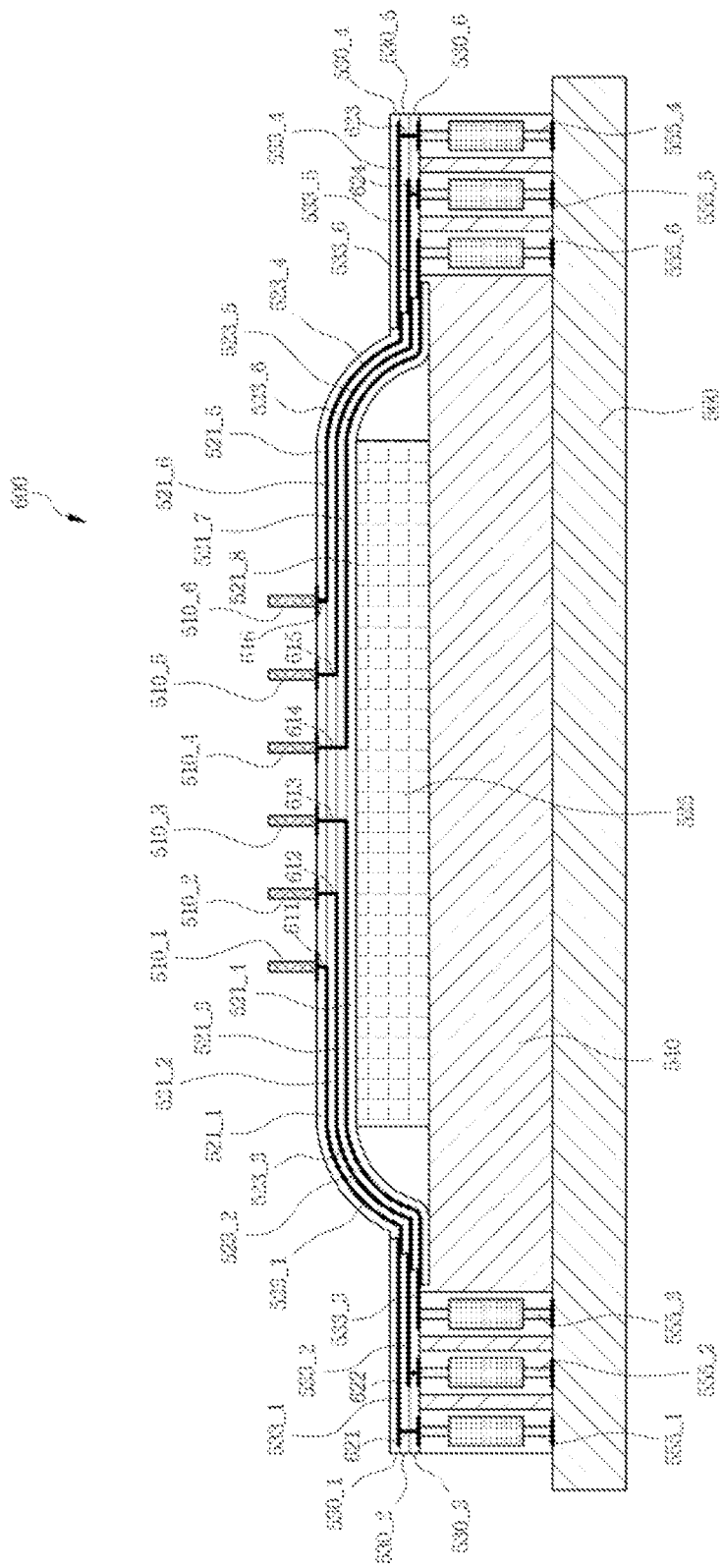
FIG. 6 is a diagram illustrating an enlarged view of an example of a probe tip, a first space converting unit, and a second space converting unit of a probe card shown in FIG. 5.

FIG. 6 is a diagram illustrating an enlarged view of an example of the probe tip, the first space converting unit, and the second space converting unit of the probe card shown in FIG. 5.

Referring to FIGS. 5 and 6, the first space converting unit 520 may have first wiring (not shown) on a top surface and pads that electrically connect the first wiring and the probe tips 510_1, 510_2, 510_3, 510_4, 510_5, and 510_6. Then, the first space converting unit 520 may include multi-layers 521_1, 521_2, 521_3, and 521_4 of a predetermined insulation material, and have at least one of second wirings 523_1, 523_2, 523_3, 523_4, 523_5, 523_6, 523_7, and 523_8 on an upper surface of each layer. However, the disposition of the second wirings may not be limited to an upper surface of each layer, and the second wirings may be formed on a lower surface of each layer. On at least one end of the first space converting unit 520, the multi-layers of the predetermined insulation material and the second wirings may be formed to be stepwise. For example, the insulation material may be polyimide.

The second space converting unit 530 may have multi-layers 530_1, 530_2, 530_3, 530_4, 530_5, and 530_6 of the predetermined insulation material, and have at least one of third wirings 533_1, 533_2, 533_3, 533_4, 533_5, 533_6 formed on a lower surface of each layer 530_1, 530_2, 530_3, 530_4, 530_5, and 530_6. The disposition of the third wirings may not be limited to the lower surface of each layer, and the third wirings may be formed on an upper surface of each layer. On at least one end of the second space converting unit 530, the multi-layers of the predetermined insulation material and the third wirings may be formed to be stepwise. For example, the insulation material may be polyimide.

The pads electrically connected to the first wirings may be electrically connected to the corresponding second wirings 523_1, 523_2, 523_3, 523_4, 523_5, 523_6, 523_7, and 523_8 through corresponding first via-holes 611, 612, 613, 614, 615, and 616. The second wirings stepwise formed on one end of the first space converting unit 520 and the third wirings 533_1, 533_2, and 533_3 stepwise formed on one end of the second space converting unit 530 may be compressively coupled and electrically connected to each other. In addition, the second wirings 523_4, 523_5, and 523_6 stepwise formed on the other end of the first space converting unit 520 and the third wirings 533_4, 533_5, and 533_6 stepwise formed on the other end of the second space converting unit 530 may be compressively coupled and electrically connected to each other. The pads disposed on the lower surface of the second space converting unit 530 may be electrically connected to the corresponding interposers 555 as described in connection with FIG. 5.

For example, under the assumption that the test signal is transmitted to the pads disposed on the lower surface of the second space converting unit 530 via the circuit board 560 and the interposers 555, the test signal transmitted through the second via-hole 621 may pass through the second wiring 533_1, the first wiring 523_1 and the first via-hole 611 and reach the probe tip 510_1. The test signal transmitted through the second via-hole 622 may pass through the second wiring 533_2, the first wiring 523_2, and the first via-hole 612 and reach the probe tip 510_2. The test signal transmitted through the interposer 555_3 may pass through the second wiring 533_3, the first wiring 523_3 and the first via-hole 613 and reach the probe tip 510_3. In addition, the test signal transmitted through the second via-hole 623 may pass through the second wiring 533_4, the first wiring 523_4, and the first via-hole 616 and reach the probe tip 510_6. The test signal transmitted through the second via-hole 625 may pass through the second wiring 533_5, the first wiring 523_5, and the first via-hole 615 and reach the probe tip 510_5. The test signal transmitted through the interposer 555_6 may pass through the second wiring 533_6, the first wiring 523_6, and the first via-hole 614 and reach the probe tip 510_4.

The probe tip 510, the first space converting unit 520 and the second space converting unit 530 illustrated in FIG. 6 are only for purposes of example of FIG. 5, and the present invention is not limited thereto. Configurations of the probe tip 510, the first space converting unit 520, and the second space converting unit 530 may vary as long as they can transmit a test signal.

Figure 7:
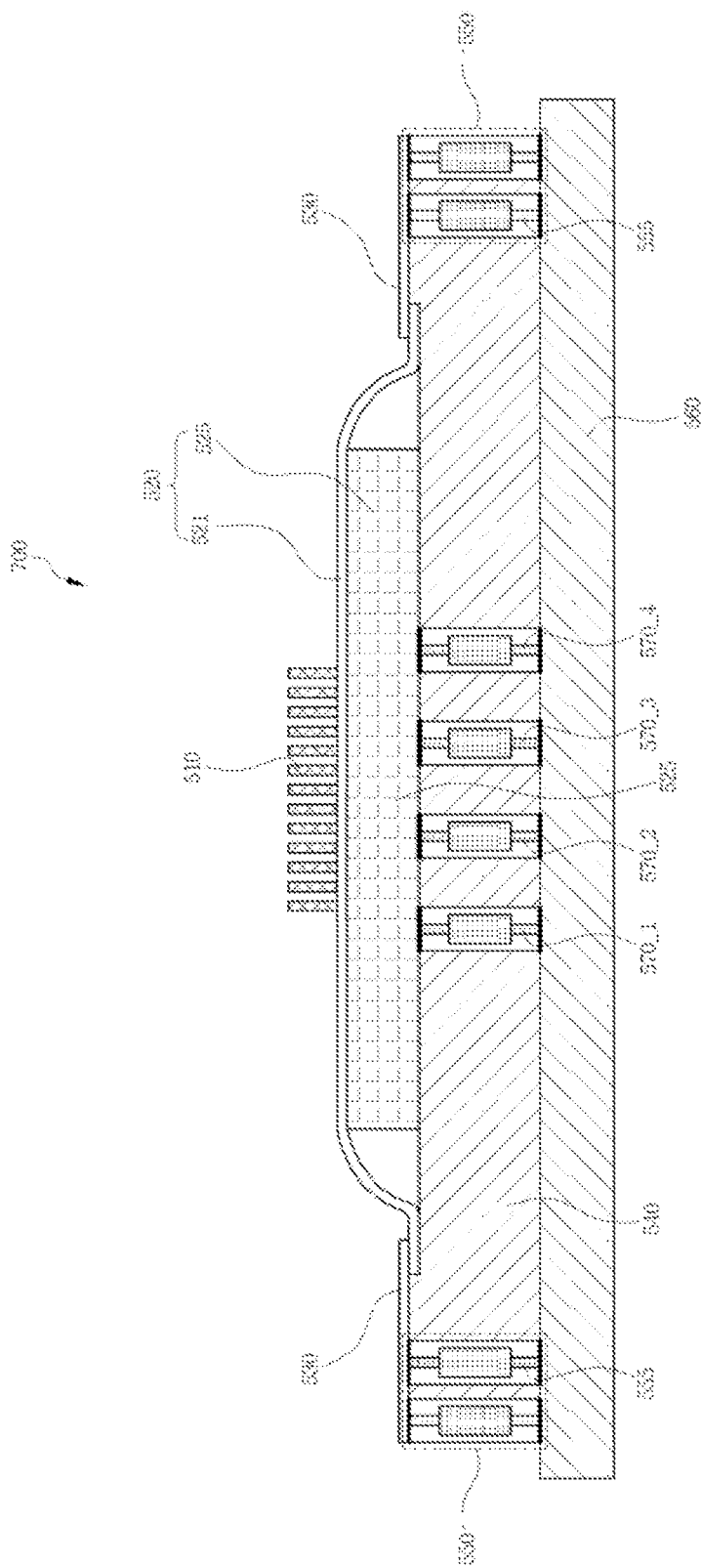
FIG. 7 is a diagram illustrating another example of a probe card.

FIG. 7 is a diagram illustrating another example of a probe card.

Referring to FIGS. 5 to 7, the probe card 700 may include a plurality of holes passing through a top and bottom of the frame 540 between the first space converting unit 520 and the circuit board 560, and elastic members 570_1, 570_2, 570_3, and 570_4 inserted into the respective holes to provide elasticity between the first space converting unit 520 and the circuit board 560. The elastic members 570_1, 570_2, 570_3, and 570_4 may have the same configurations of the interposers 555 illustrated in FIG. 5. For example, the elastic members 570_1, 570_2, 570_3, and 570_4 may be pogo pins or curved pins as described in connection with FIG. 4, but the elastic members 570_1, 570_2, 570_3, and 570_4 are not limited thereto. Any other elements may be used instead of the elastic members as long as they can provide elasticity between the first space converting unit 520 and the circuit board 560.

The probe card 700 illustrated in FIG. 7 has the same configuration of the probe card 500 illustrated in FIG. 5 except that there are provided a plurality of holes to the frame 540 and the elastic members 570_1, 570_2, 570_3, and 570_4 are inserted into the respective holes, and thus the detailed descriptions of the remaining elements of the probe card 700 will not be reiterated.

Figure 8:
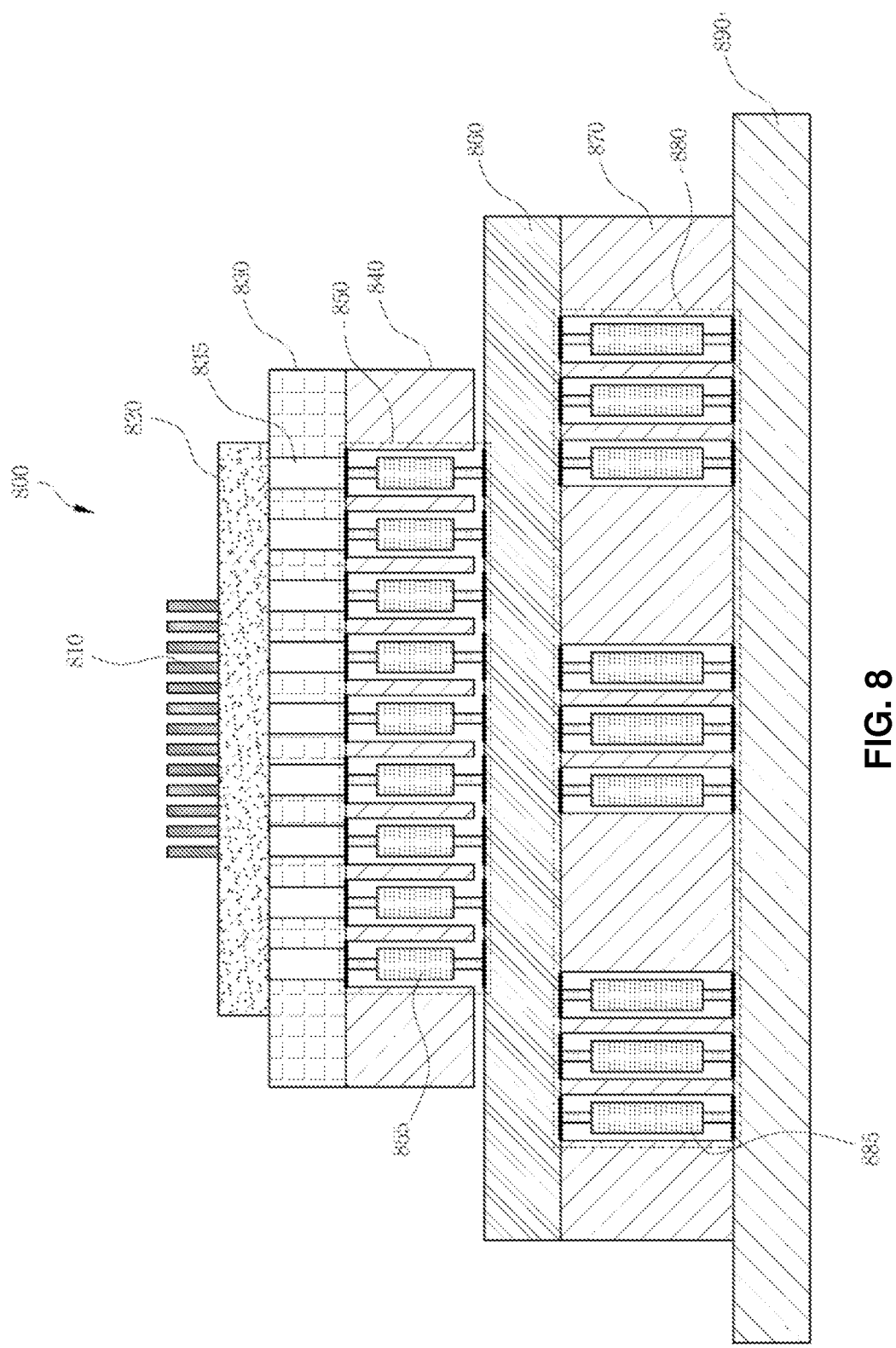
FIG. 8 is a diagram illustrating another example of a probe card.

FIG. 8 is a diagram illustrating another example of a probe card.

Referring to FIG. 8, the probe card 800 may include a plurality of probe tips 810, a first space converting unit 820, a second space converting unit 830, a first frame 840, a first interposer unit 850, a third space converting unit 860, a second frame 870, a second interposer unit 880, and a circuit board 890. The probe card 800 shown in FIG. 8 is capable of simultaneously contacting a plurality of target chip pads and testing the target chip pads.

The probe tips 810, each being ball-shaped or straight-pillar-shaped, may be in contact with a plurality of target chip pads. In other words, the probe tips 810 shown in FIG. 8 can contact a plurality of target chip pads simultaneously. The probe tips 810 are similar to the probe tips 110 shown in FIG. 1, and thus detailed description thereof will not be reiterated.

The first space converting unit 820 may include first wiring formed on a top surface to be electrically connected to lower ends of the probe tips 810, and second wiring formed in multi-layers to be electrically connected to the first wiring formed on the top surface of the first space converting unit 820. For example, the first space converting unit 820 may include multi-layers of polyimide, and have one or more second wiring on an upper surface of each layer. The first space converting unit 820 is similar to the first space converting unit 120 illustrated in FIG. 1, and thus the detailed description thereof will not be reiterated.

The second space converting unit 830 may include third wiring formed on a top surface thereof to be electrically connected to the second wirings in multi-layers of the first space converting unit 820. The third wiring may be electrically connected to pads disposed on a bottom surface of the second space converting unit 830. The second space converting unit 830 may be formed of a silicon wafer, and include a plurality of via-holes 835 to electrically connect the third wiring to the pads on the bottom surface thereof, but the present invention is not limited thereto. The second space converting unit 830 may be formed of a different material, and include a different means (for example, a bonding wire, an anisotropic conductive film, etc.) other than the via-holes to electrically connect the third wiring to the pads. The second space converting unit 830 is similar to the second space converting unit 830 illustrated in FIG. 1, and thus the detailed description thereof will not be reiterated.

The first frame 840 may be interposed between the second space converting unit 830 and the third space converting unit 860, thereby supporting the second space converting unit 830. The first frame 840 may include a hole passing through a top and bottom of the first frame 840 into which the first interposer unit 850 can be inserted. The first frame 840 may be coupled to at least one of the second space converting unit 830 and the third space converting unit 860 at a predetermined spacing. In specific, so as to ensure a space in which first interposers 855 of the first interposer unit 850 that will be described below can move freely enough to provide stable elasticity, the first frame 840 is coupled to at least one of the second space converting unit 830 and the third space converting unit 860 at a predetermined spacing. The coupling between the first frame 840 and the space converting unit 830 or 860 at a predetermined spacing is described in connection with FIG. 1, and thus the detailed description thereof will not be reiterated.

The first interposer unit 850 located inside the hole formed in the first frame 840 may support the second space converting unit 830. The first interposer unit 850 may include a guide frame (for example, a silicon wafer) having a plurality of holes, each passing through a top and bottom of the guide frame, and a plurality of first interposers 855 that electrically connect the pads disposed on the second space converting unit 830 and fourth wiring formed on a top surface of the third space converting unit 860, provides elasticity, and are inserted into the holes of the guide frame. The first interposers 855 may be pogo pins or curved pins that provide elasticity between the fourth wiring formed on the top surface of the third space converting unit 860 and the pads disposed on the bottom surface of the second space converting unit 830. The curved pins are described in detail in connection with FIG. 4 and the first interposers 855 are similar to the interposers 155 illustrated in FIG. 1, and thus detailed descriptions thereof will not be reiterated.

The third space converting unit 860 may include fourth wiring formed on a top surface thereof to be electrically connected to lower ends of the first interposers 855, and fifth wiring formed in multi-layers to be electrically connected to the fourth wiring. For example, the third space converting unit 860 may include multi-layers of polyimide, and have one or more fifth wirings on an upper layer of each layer. That is, the fifth wirings may be electrically connected to the respective first interposers 855 through the wirings formed on the top surface of the third space converting unit 830, but the present invention is not limited thereto. The third space converting unit 860 may be made of a different material. The fifth wirings may be electrically connected to the fourth wiring through via-holes, and be electrically connected to pads disposed on a bottom surface of the third space converting unit 860 through the via-holes, but the present invention is not limited thereto. The third space converting unit 860 may be electrically connected through other elements (for example, a bonding wire, an anisotropic conductive film, or the like) other than the via-holes.

The second frame 870 may support the third space converting unit 860, being interposed between the third space converting unit 860 and the circuit board 890. In addition, the second frame 870 may include a hole passing through a top and bottom thereof, into which the second interposer unit 880 may be inserted. The second frame 870 may be coupled to at least one of the third space converting unit 860 and the circuit board 890 at a predetermined spacing. In specific, so as to ensure a space in which second interposers 885 of the second interposer unit 880 that will be described in greater detail later can move freely enough to provide elasticity, the second frame 870 may be coupled to at least one of the third space converting unit 860 and the circuit board 890 at a predetermined spacing. A configuration for coupling between the second frame 870 and the space converting unit 860 or the circuit board 870 at a predetermined spacing is described in detail in connection with FIG. 1, and thus the detailed description thereof will not be reiterated.

The second interposer unit 880 located inside the hole formed in the second frame 870 may support the third space converting unit 860. The second interposer unit 880 may include a guide frame (for example, a silicon wafer) having a plurality of holes passing through a top and bottom of the guide frame and a plurality of second interposers 885 that electrically connect the pads disposed on the bottom surface of the third space converting unit 860 and the circuit board 870, provide elasticity and are inserted into the hole of the guide frame. The second interposers 885 may be pogo pins or curved pins. The curbed pins are described in greater detail in connection with FIG. 4, and thus the detailed description thereof will not be reiterated. The above examples demonstrate the second interposers 885 as pogo pins or curved pins, but the present invention is not limited thereto. Any other elements may be used as the second interposers 885 as long as they can electrically connect the corresponding pads disposed on the bottom surface of the third space converting unit 860 and the circuit board 890 or electrically connect them, providing elasticity.

The circuit board 890 may support the second interposer unit 880 and the second frame 870, and transmit a test signal since the circuit board 890 is electrically connected to the second interposers 885. In more detail, the circuit board 890 may transmit the applied test signal to the second interposers 885 and the second interposers 885 may transmit the test signal to the third space converting unit 860. The third space converting unit 860 may receive the test signal through the pads disposed on the bottom surface thereof, and transmit the test signal to the fourth wiring through the fifth wirings. The first interposers 855 may transmit the test signal to the second space converting unit 830. The second space converting unit 830 may receive the test signal through the pads disposed on the bottom surface thereof, and transmit the receive test signal to the third wirings through the via-holes 835. Then, the first space converting unit 820 may transmit the test signal to the first wiring through the second wiring from the third wirings, and the probe tips 810 electrically connected to the first wiring may be able to receive the test signal. Accordingly, the probe tips 810 is enabled to transmit the test signal to the target chip pads that are in contact with the probe tips 810.

Figure 9:
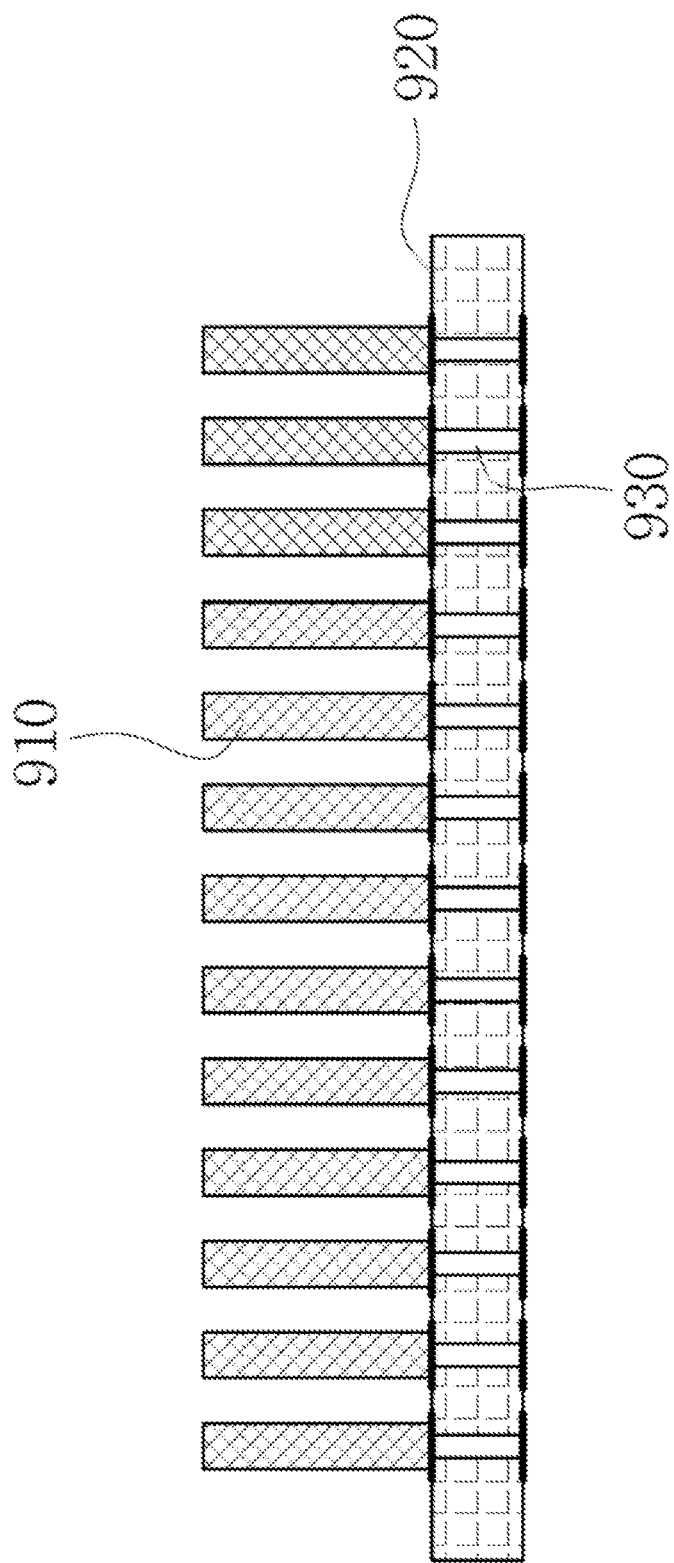
FIG. 9 is a diagram illustrating an example of a silicon wafer to which probe tips are coupled.

FIG. 9 is a diagram illustrating an example of a silicon wafer to which probe tips are coupled.

In the examples shown in FIGS. 1 to 8, the probe tips are mounted on the first space converting unit, but they may be coupled to the silicon wafer 920 as shown in FIG. 9, and thereby they can be detachably mounted on the first space converting unit. In other words, referring to FIGS. 1 to 9, the probe tips 910 may be coupled to an upper surface of the silicon wafer 920. Furthermore, the silicon wafer 920 may include a plurality of via-holes 930 to electrically connect the probe tips 910 and pads disposed on a bottom surface of the silicon wafer 920. The via-holes 930 formed on the silicon wafer 920 may be electrically connected to the first wiring on a top surface of the first space converting unit.

Figure 10:
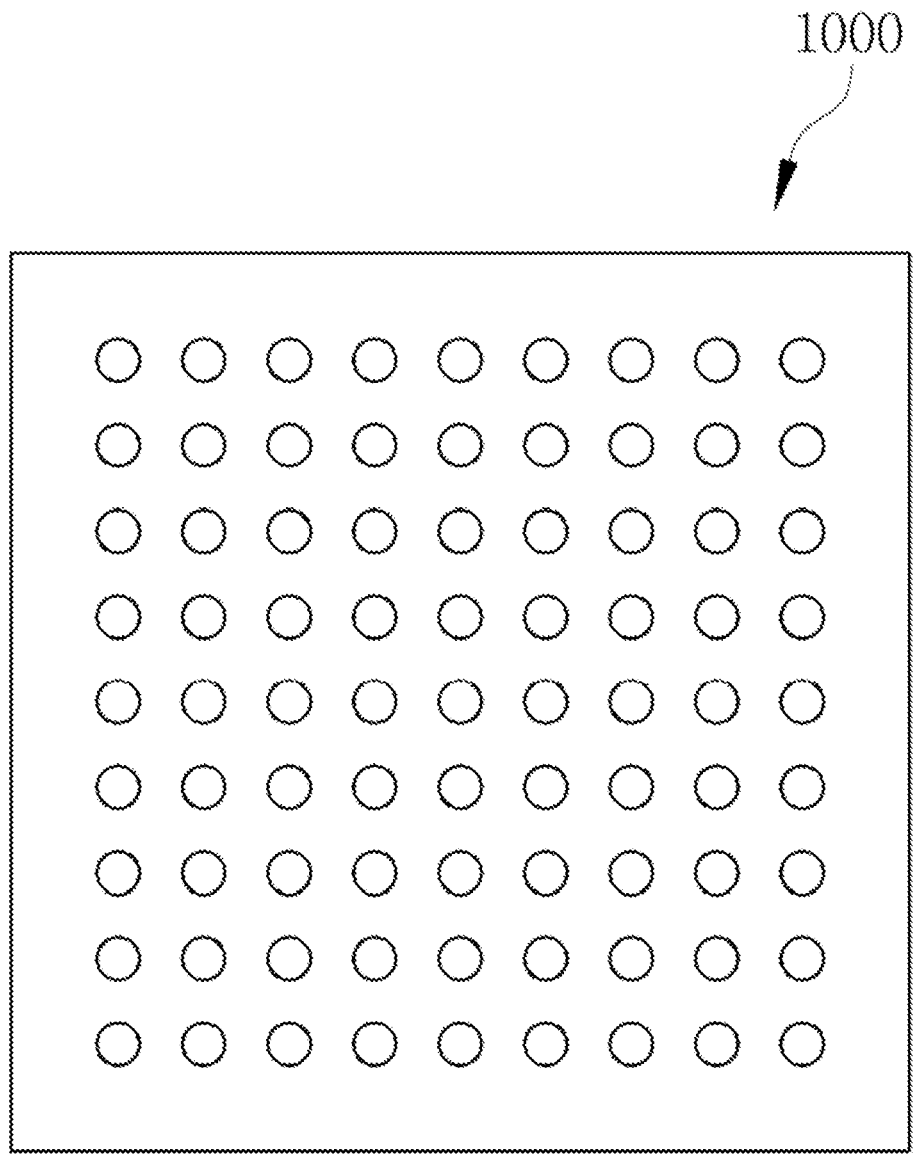
FIG. 10 is a diagram illustrating an example of a target chip to be tested using a probe card.

FIG. 10 is a diagram illustrating an example of a target chip to be tested using a probe card.

Referring to FIGS. 1 to 10, the target chip 1000 may include a plurality of pads arranged in an area. In this example, a plurality of probe tips as described with reference to FIGS. 1 to 9 may be arranged in an area, having the same pitch as a pitch between a plurality of pads in the target chip 1000. Accordingly, because the probe tips are straight-pillar shaped or ball-shaped in the above examples, it is possible to easily test the pads of the target chip 1000 even when the pitch of the pads is narrow.

As described above, the probe card employs straight-pillar shaped or ball-shaped probe tips, instead of conventional curved probe needles, to be in contact with target chip pads to be tested, so that an area or space occupied by the probe needles can be reduced and thus the target chip including pads having a narrow pitch can be accurately tested.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A probe card comprising:
   a plurality of probe tips, each being ball-shaped or pillar-shaped and having a top end in contact with each of target chip pads to be tested;
   a first space converting unit configured to have first wirings formed on a top surface thereof to be electrically connected to a bottom end of each of the probe tips and second wirings formed in multi-layers to be electrically connected to the wirings formed on the top surface;
   a second space converting unit configured to have third wirings formed on a top surface thereof to be electrically connected to the second wirings in multi-layers of the first space converting unit and pads disposed on a bottom surface that are electrically connected to the third wirings;
   a frame configured to support the second space converting unit;
   an interposer unit configured to comprise interposers being located in holes formed in the frame to support the second space converting unit, being electrically connected to the pads of the second space converting unit and providing elasticity; and
   a circuit board configured to support the interposer unit and transmit a test signal to the interposers that are electrically connected to the circuit board,
   wherein the second space converting unit is configured to be formed of a silicon wafer and have a plurality of via-holes to electrically connect the third wirings and the pads disposed on the bottom surface of the second space converting unit.

2. The probe card of claim 1, wherein the frame is coupled to at least one of the second space converting unit and the circuit board at a predetermined spacing.

3. The probe card of claim 1, wherein the plurality of probe tips are coupled to a top surface of a silicon wafer and thus detachable from the first space converting unit and the silicon wafer has a plurality of via-holes to electrically connect the probe tips and the pads on the bottom surface and enables the pads on the bottom surface to be electrically connected to the first wiring.

4. The probe card of claim 1, wherein the first space converting unit is configured to have a plurality of first via-holes to electrically connect the respective second wirings and the first wirings and a plurality of second via-holes to electrically connect the respective second wirings to pads disposed on a bottom surface of the first space converting unit, and the pads disposed on the first space converting unit are electrically connected to the third wirings.

5. The probe card of claim 1, wherein the first space converting unit is configured to have multi-layers of polyimide and have at least one of the second wirings formed on an upper surface of each layer.

6. The probe card of claim 1, wherein the interposers are pogo pins or curved pins that are interposed between the circuit board and the pads disposed on the bottom surface of the second space converting unit and provide elasticity.

7. The probe card of claim 6, wherein the interposers are curved pins and each of the curved pins is formed by integrating a first straight body to be electrically connected to the pad disposed on the bottom surface of the second space converting unit, a second straight body to be electrically connected to the circuit board, and a curved body electrically connected between the first and second straight bodies to provide elasticity.

* * * * *